(12) United States Patent
Shimizu

(10) Patent No.: US 8,493,095 B2
(45) Date of Patent: Jul. 23, 2013

(54) SEMICONDUCTOR DEVICE WITH CLOCK STOP DETECTION

(75) Inventor: Yuichiro Shimizu, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 78 days.

(21) Appl. No.: 13/211,746

(22) Filed: Aug. 17, 2011

(65) Prior Publication Data

US 2012/0119786 A1    May 17, 2012

(30) Foreign Application Priority Data

Nov. 12, 2010   (JP) ................. 2010-254084

(51) Int. Cl.
*G01R 23/02*   (2006.01)
*H03D 3/00*    (2006.01)
*H03K 9/06*    (2006.01)

(52) U.S. Cl.
USPC .............................. 327/48; 327/18

(58) Field of Classification Search
USPC .................................... 327/18, 48
See application file for complete search history.

(56) References Cited

U.S. PATENT DOCUMENTS 7,250,803 B2 *   7/2007   Kazuma ............... 327/291
7,352,214 B2 *   4/2008   Evans et al. ............ 327/18

FOREIGN PATENT DOCUMENTS

JP           8-063449 A      3/1996

* cited by examiner

*Primary Examiner* — John Poos
(74) *Attorney, Agent, or Firm* — Fujitsu Patent Center

(57) ABSTRACT

A stop of a detection object clock is detected by inverting a signal level of an output signal of a level output unit at a count completion time at a counter unit operated by a detection clock and of which count value is changeable, and by determining whether or not a signal level change passes through a clock detection unit operated by the detection object clock by comparing signal levels of an output signal of a level output unit and an output signal of a clock detection unit.

6 Claims, 5 Drawing Sheets

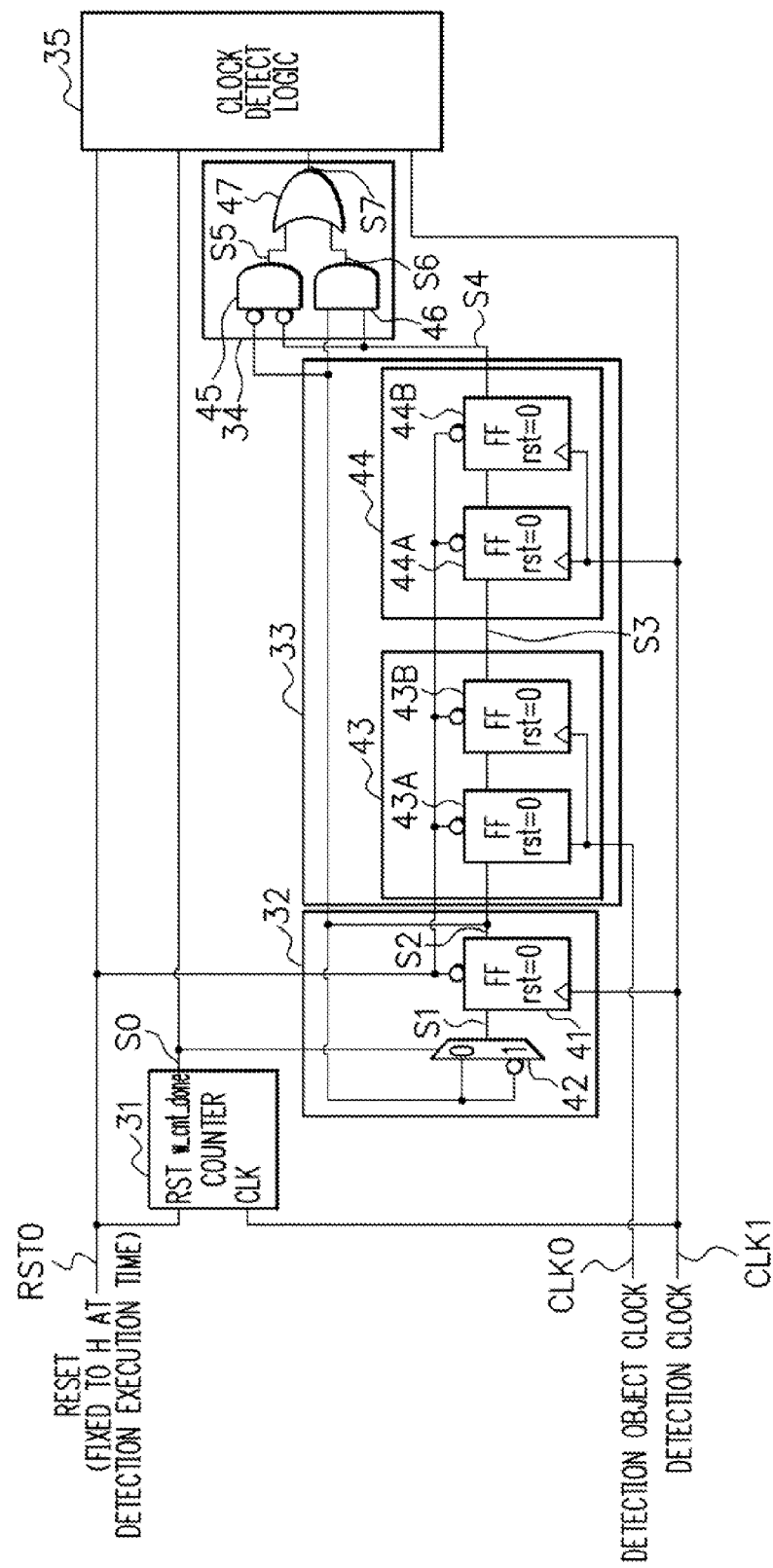
F I G. 4

SEMICONDUCTOR DEVICE WITH CLOCK STOP DETECTION

CROSS-REFERENCE TO RELATED APPLICATION

This application is based upon and claims the benefit of priority of the prior Japanese Patent Application No. 2010-254084, filed on Nov. 12, 2010, the entire contents of which are incorporated herein by reference.

FIELD

The embodiments discussed herein are directed to a clock stop detection technology used in the semiconductor device.

BACKGROUND

In general, a semiconductor integrated circuit operates by a crystal oscillation clock input from external. However, a crystal oscillator is easy to be broken because it is attached on a board and so on, and there is a case when a supply of a clock is stopped when the semiconductor integrated circuit is in operation. Accordingly, many microcontrollers perform a detection whether the clock input from external is stopped or not by using an oscillation clock of an oscillation circuit mounted inside a chip.

A method in which a reset (clear) is regularly input to a flip-flop in which a detection object clock is supplied and a certain output is set by detecting an edge of the detection object clock by using a detection clock, and the clock stop is detected by checking that the output of the flip-flop is not changed at the reset input time, is proposed as a method to detect the clock stop (for example, refer to Patent Document 1). Note that it is assumed that a frequency of the detection object clock is higher than a frequency of the detection clock in the technology discussed in Patent Document 1.

However, it is not easy in a conventional clock stop detection method to adjust a frequency ratio of the detection object clock and the detection clock by a circuit and a usable case is limited. Besides, the clock stop is detected by using the reset, and therefore, it is impossible to correspond to a circuit check tool such as an asynchronous verification when a clock stop detection unit is provided as a soft-macro (software macro).

[Patent Document 1] Japanese Laid-open Patent Publication No. 08-63449

SUMMARY

According to an aspect of the embodiment, a semiconductor device, including: a counter unit of which count value is changeable and operated by a detection clock; a level output unit that inverts a signal level of an output signal in accordance with an output of the counter unit; a clock detection unit that passes the output signal of the level output unit by operated by a detection object clock; a level comparison unit that compares signal levels of the output signal of the level output unit and an output signal of the clock detection unit; and a determination unit that determines whether or not the detection object clock is stopped based on a comparison result at a certain timing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating a circuit configuration example of the clock stop detection unit in the present embodiment;

DESCRIPTION OF EMBODIMENTS

Hereinafter, embodiments are described based on accompanying drawings.

Figure 1:
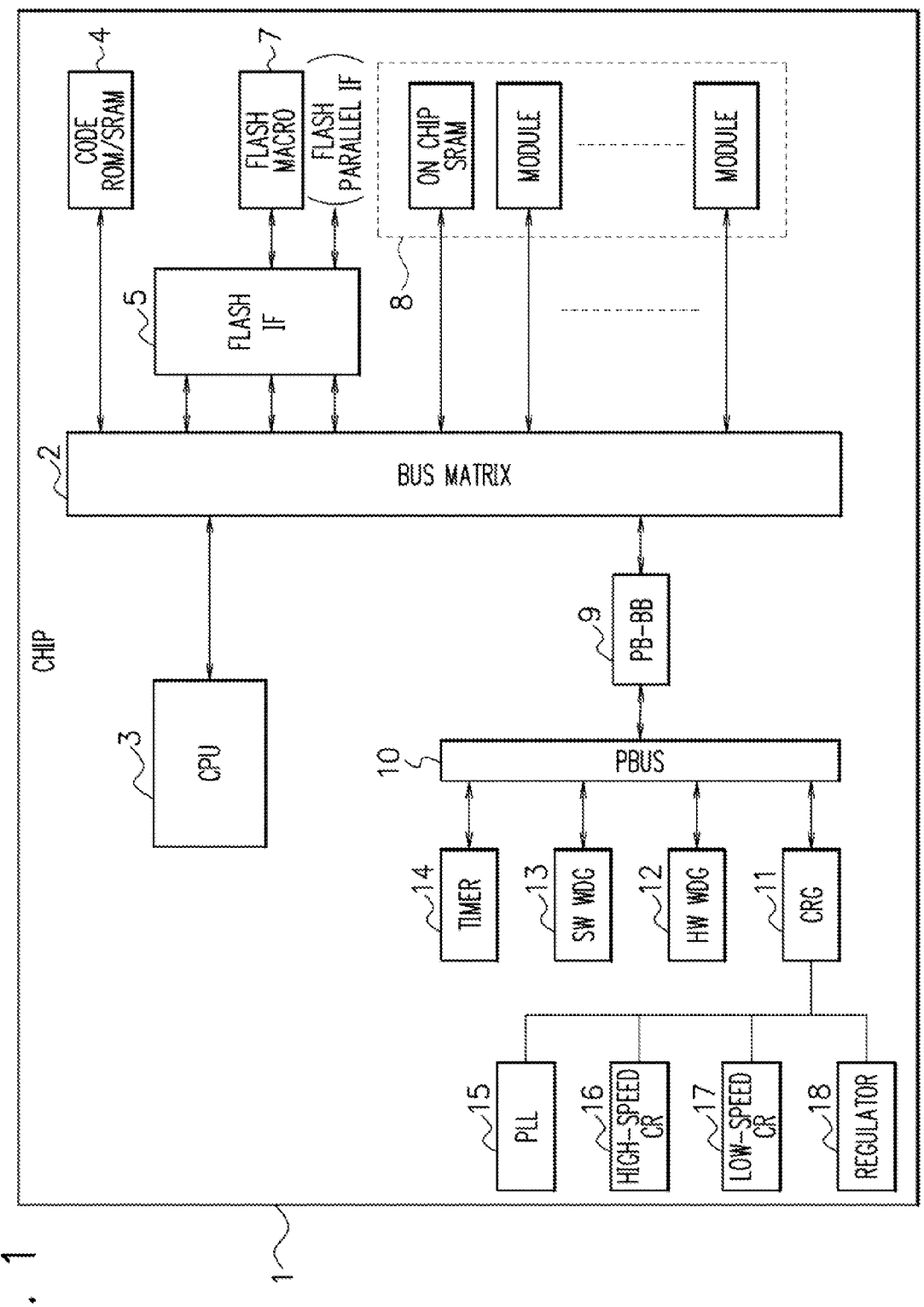
FIG. 1 is a diagram illustrating a configuration example of a microcontroller to which a semiconductor device is applied.

FIG. 1 is a diagram illustrating a configuration example of a microcontroller to which a semiconductor device is applied. In FIG. 1, a reference numeral 1 is a chip on which respective function units held by the microcontroller are mounted.

A reference numeral 3 is a CPU (Central Processing Unit), and a reference numeral 4 is a code memory to which program codes and so on are stored. The CPU 3 and the code memory 4 are each connected to a bus 2. For example, the CPU 3 executes a certain process or totally controls respective function units inside the microcontroller by reading and executing the program codes from the code memory 4.

A reference numeral 7 is a flash memory macro. The flash memory macro 7 is connected to the bus 2 via a flash memory interface 5, and writing and reading of various data and so on are performed in accordance with a request from the CPU 3 and so on. Besides, a flash parallel interface is connected to the bus 2 via the flash memory interface 5.

A reference numeral 8 represents various modules connected to the bus 2. Each of the modules 8 is, for example, an on-chip RAM (Random Access Memory), a master module, a slave module, an external memory interface, an external device interface, and so on.

A reference numeral 9 is a bus bridge controlling transfer of various signals between the bus 2 and a peripheral bus 10. Note that the bus 2 is a relatively high-speed bus so-called a high performance bus, and the peripheral bus 10 is a bus in low-speed compared to the bus 2.

A reference numeral 11 is a clock reset generation circuit. The clock reset generation circuit 11 generates a system clock supplied to the respective function units inside the chip while using an oscillation clock as an input. The clock reset generation circuit 11 generates an internal reset supplied to the respective function units by receiving a reset request from internal or external. Besides, the clock reset generation circuit 11 detects whether or not the input oscillation clock is stopped.

A reference numeral 12 is a watchdog timer in hardware, a reference numeral 13 is a watchdog timer in software, and a reference numeral 14 is a timer. Each of the clock reset generation circuit 11, the watchdog timers 12, 13, and the timer 14 is connected to the peripheral bus 10.

A reference numeral 15 is a PLL (Phase Locked Loop) circuit, a reference numeral 16 is a high-speed CR oscillation circuit oscillating a clock in high frequency, and a reference numeral 17 is a low-speed CR oscillation circuit oscillating a clock in low frequency. Each of the PLL circuit 15, the high-speed CR oscillation circuit 16, the low-speed CR oscillation circuit 17 supplies the oscillation clock to the clock reset generation circuit 11. A reference numeral 18 is a regulator. The regulator 18 converts an input voltage into an output voltage to output. The regulator 18 outputs a power-on-reset request to the clock reset generation circuit 11.

Figure 2:
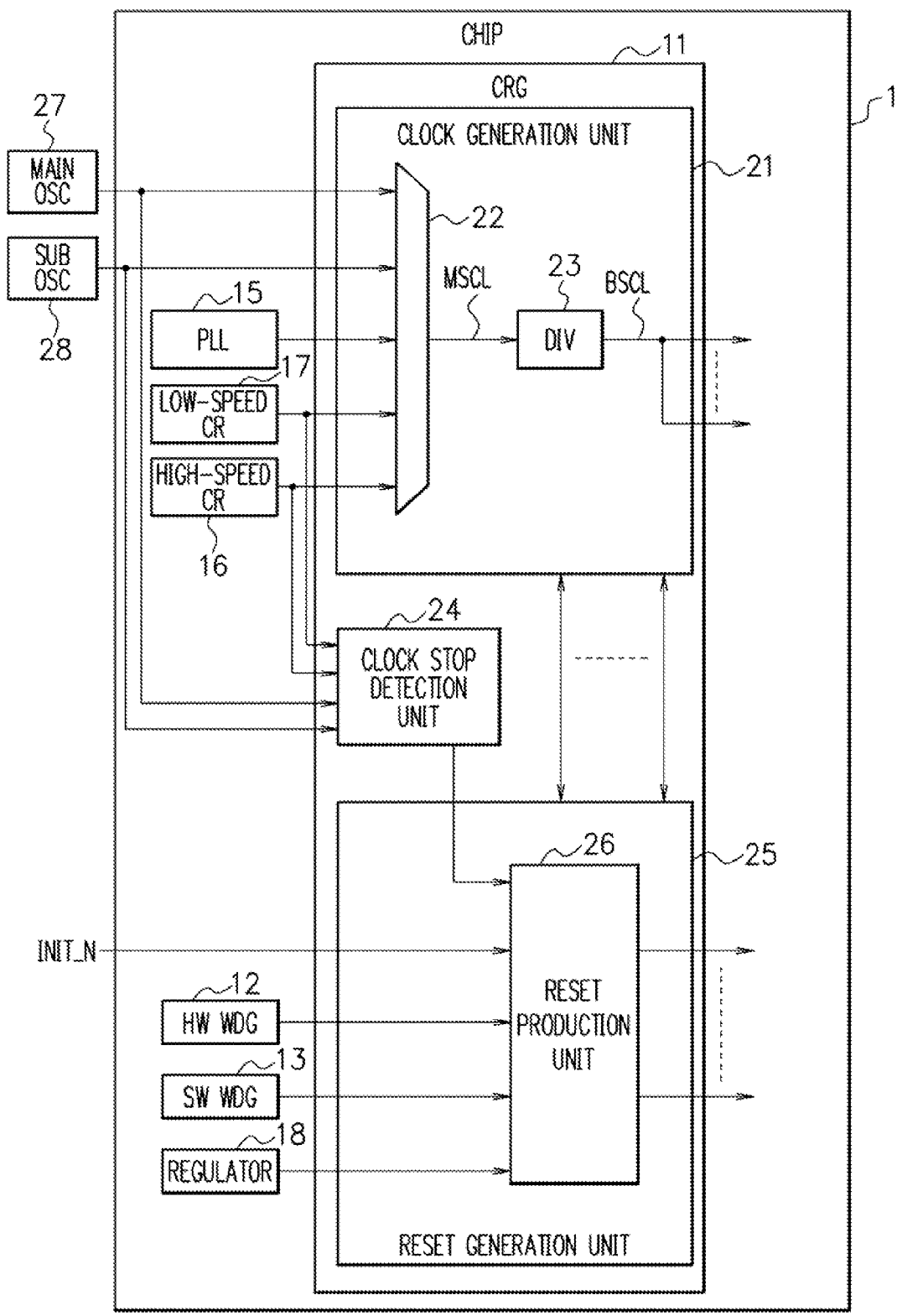
FIG. 2 is a diagram illustrating a configuration example of a clock reset generation circuit in the present embodiment.

FIG. 2 is a diagram illustrating a configuration example of the clock reset generation circuit 11 illustrated in FIG. 1. In FIG. 2, the same reference numerals and symbols are used to designate the same and corresponding components as the components illustrated in FIG. 1. As illustrated in FIG. 2, the clock reset generation circuit 11 includes a clock generation unit 21, a clock stop detection unit 24, and a reset generation unit 25.

The clock generation unit 21 generates and outputs the system clock while using the oscillation clock as the input. The clock generation unit 21 includes a selector 22 and a frequency divider 23. The oscillation clock oscillated from each of an external main oscillator 27, an external sub oscillator 28, the PLL circuit 15, the high-speed CR oscillation circuit 16, and the low-speed CR oscillation circuit 17 is input to the selector 22. The selector 22 selects the input oscillation clock, and outputs as a master clock MSCL. The master clock MSCL output from the selector 22 is input to the frequency divider 23. The frequency divider 23 divides the master clock MSCL with a specified frequency division ratio to output as a base clock BSCL. This base clock BSCL (it may be the master clock MSCL) is supplied from the clock generation unit 21 to the respective function units (CPU, modules and so on) inside the microcontroller as the system clock.

The oscillation clock oscillated from each of the external main oscillator 27, the external sub oscillator 28, the high-speed CR oscillation circuit 16, and the low-speed CR oscillation circuit 17 is input to the clock stop detection unit 24. The clock stop detection unit 24 detects whether or not the oscillation clock is stopped.

The reset generation unit 25 includes a reset production unit 26, and generates and outputs a reset signal by receiving the reset request from internal or external. A reset request (INIT_N) from external, and a clock stop detection reset request from the clock stop detection unit 24 are input to the reset production unit 26. Besides, a hardware watchdog reset request from the watchdog timer 12, a software watchdog reset request from the watchdog timer 13, and the power-on-reset request from the regulator 18 are input to the reset production unit 26. The reset production unit 26 generates the reset signals in accordance with these reset requests, and outputs the generated reset signals to the respective function units (CPU, modules and so on) inside the microcontroller.

Figure 3:
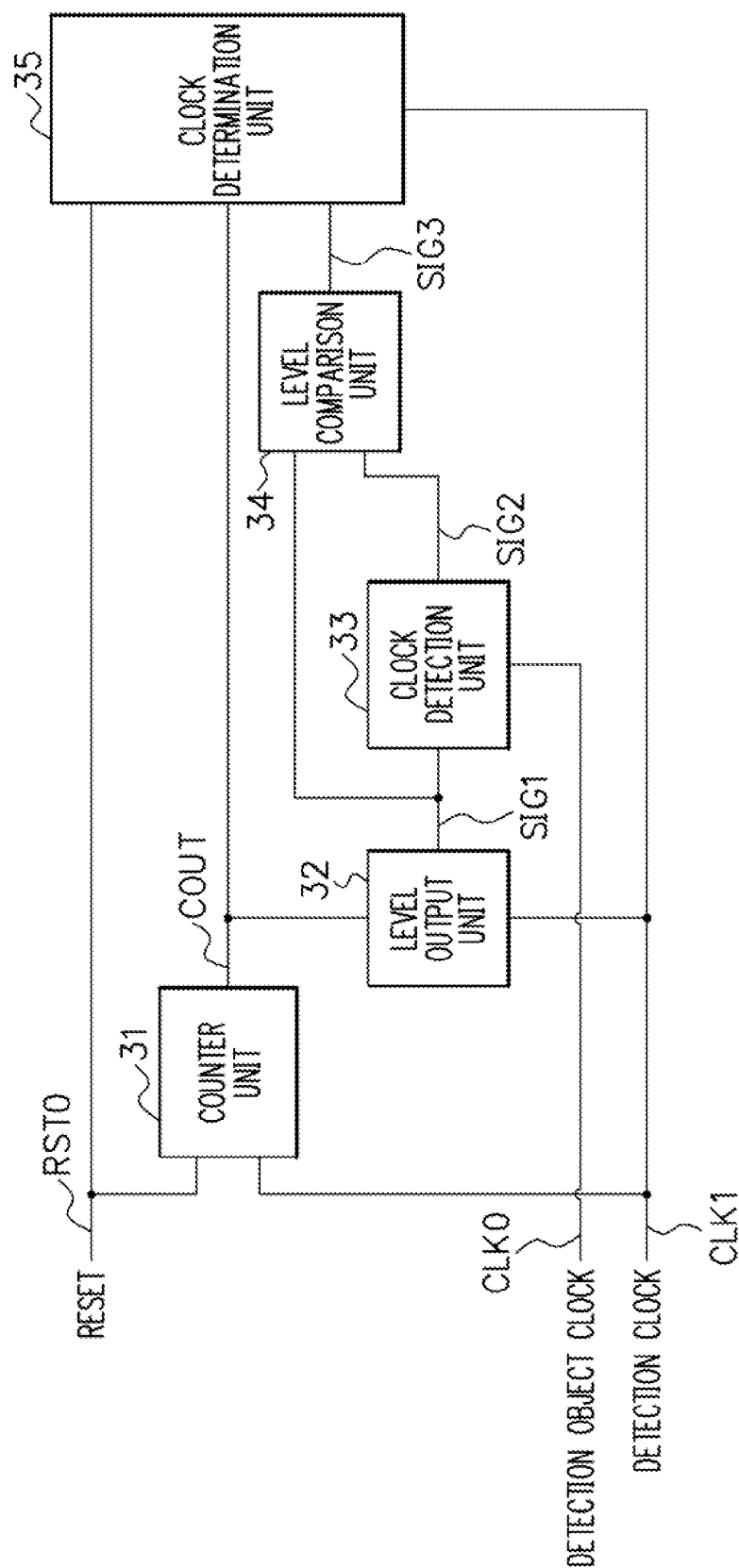
FIG. 3 is a diagram illustrating a configuration example of a clock stop detection unit in the present embodiment.

FIG. 3 is a diagram illustrating a configuration example of the clock stop detection unit 24 in the present embodiment. The clock stop detection unit 24 in the present embodiment includes a counter unit 31, a level output unit 32, a clock detection unit 33, a level comparison unit 34, and a clock determination unit 35 as illustrated in FIG. 3. Note that a reset signal RST0 is illustrated in FIG. 3, but it is not used in the detection operation of the clock stop at the clock stop detection unit 24, and the reset signal RST0 is fixed at high level at the clock stop detection operation time (it is negated).

The counter unit 31 is a counter operated by a detection clock CLK1. The counter unit 31 asserts an output signal COUT in a pulse state when count is completed. Besides, the counter unit 31 starts a count operation from an initial value again when the count is completed. Here, a count value of the counter unit 31 is changeable. The count value of the counter unit 31 can be set appropriately in accordance with, for example, a frequency ratio of the detection object clock CLK0 and the detection clock CLK1. The level output unit 32 operates by the detection clock CLK1, and inverts a signal level of an output signal SIG1 when the output signal COUT of the counter unit 31 is asserted.

The clock detection unit 33 operates by the detection object clock CLK0, and outputs an output signal SIG2 which is in the same signal level as the output signal SIG1 of the level output unit 32 by using the detection object clock CLK0. In other words, the output signal SIG1 passes through the clock detection unit 33, and is output as the output signal SIG2 when the detection object clock CLK0 is not stopped, and the output signal SIG1 does not pass through the clock detection unit 33 when the detection object clock CLK0 is stopped.

The level comparison unit 34 compares the signal level of the output signal SIG1 of the level output unit 32 and the signal level of the output signal SIG2 of the clock detection unit 33. The level comparison unit 34 asserts an output signal SIG3 when the signal levels of the output signal SIG1 and the output signal SIG2 are the same, and otherwise, does not assert the output signal SIG3.

The clock determination unit 35 determines whether or not the detection object clock CLK0 is stopped based on the output signal COUT of the counter unit 31 and the output signal SIG3 of the level comparison unit 34. The clock determination unit 35 monitors the output signal SIG3 of the level comparison unit 34 when the output signal COUT of the counter unit 31 is asserted. The clock determination unit 35 determines that the detection object clock CLK0 is stopped when the monitored output signal SIG3 is not asserted. The clock determination unit 35 may output a clock stop detection reset request to the reset generation unit 25 when, for example, it is determined that the detection object clock CLK0 is stopped.

FIG. 4 is a diagram illustrating a circuit configuration example of the clock stop detection unit 24 in the present embodiment.

The counter unit 31 operates by the detection clock CLK1, and sets an output signal S0 at high-level ("H") in a pulse state when the count is completed.

The level output unit 32 includes a flip-flop 41 to which the detection clock CLK1 is supplied as a clock, and a selector 42. An output signal S1 of the selector 42 is input to the flip-flop 41 as an input signal, and the flip-flop 41 outputs an output signal S2. The output signal S2 of the flip-flop 41, and the output signal S0 of the counter unit 31 as a selection signal are input to the selector 42. The selector 42 outputs the output signal S2 of the flip-flop 41 as the output signal S1 when the output signal S0 is at low-level ("L"), and inverts and outputs the output signal S2 of the flip-flop 41 as the output signal S1 when the output signal S0 is "H". Accordingly, the level output unit 32 maintains the signal level of the output signal when the output signal S0 of the counter unit 31 is "L", and inverts the signal level of the output signal when the output signal S0 of the counter unit 31 is "H".

The clock detection unit 33 includes a clock transfer circuit 43 to which the detection object clock CLK0 is supplied as a clock, and a clock transfer circuit 44 to which the detection clock CLK1 is supplied as a clock. The clock transfer circuit 43 includes flip-flops 43A, 43B connected in series. The output signal S2 of the flip-flop 41 in the level output unit 32 is input to the flip-flop 43A, and an output of the flip-flop 43B is output as an output signal S3. Besides, the clock transfer circuit 44 includes flip-flops 44A, 44B connected in series. The output signal S3 of the clock transfer circuit 43 is input to the flip-flop 44A, and an output of the flip-flop 44B is output as an output signal S4.

The level comparison unit 34 includes AND circuits (logical product operation circuits) 45, 46 and an OR circuit (logical sum operation circuit) 47. The output signal S2 of the flip-flop 41 in the level output unit 32 and the output signal S4 of the clock transfer circuit 44 in the clock detection unit 33 are inverted and input to the AND circuit 45, and the AND circuit 45 outputs a logical product operation result thereof as an output signal S5. Besides, the output signal S2 of the flip-flop 41 in the level output unit 32 and the output signal S4 of the clock transfer circuit 44 in the clock detection unit 33 are input to the AND circuit 46, and the AND circuit 46 outputs a logical product operation result thereof as an output signal S6. The output signal S5 of the AND circuit 45 and the output signal S6 of the AND circuit 46 are input to the OR circuit 47, and the OR circuit 47 outputs a logical sum operation result thereof as an output signal S7. Namely, the level comparison unit 34 outputs the output signal S7 at "H" when the signal levels of the output signal S2 of the flip-flop 41 in the level output unit 32 and the output signal S4 of the clock transfer circuit 44 in the clock detection unit 33 are the same. The output signal S7 corresponds to the output signal SIG3 illustrated in FIG. 3.

Figure 5:
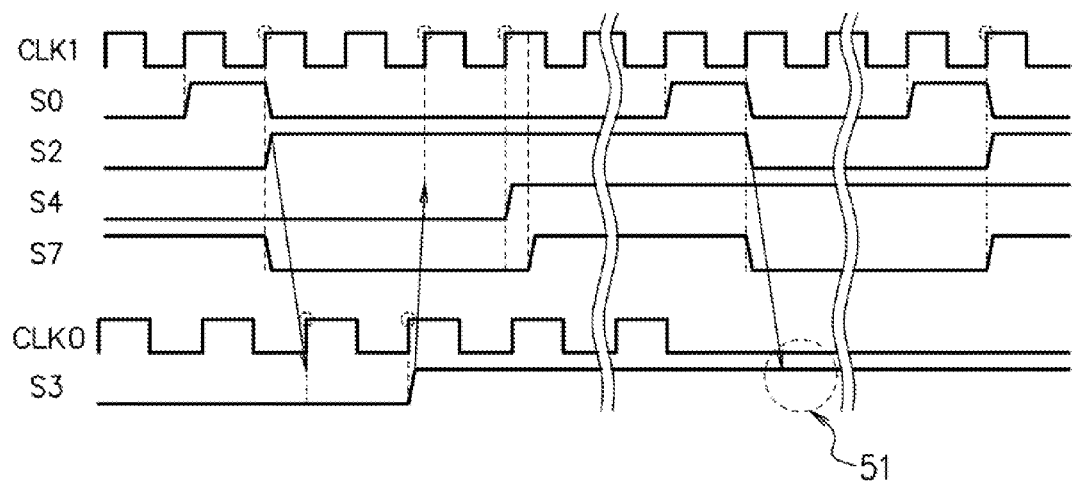
FIG. 5 is a diagram illustrating an example of operational waveforms of the clock stop detection unit in the present embodiment.
Figure 6:
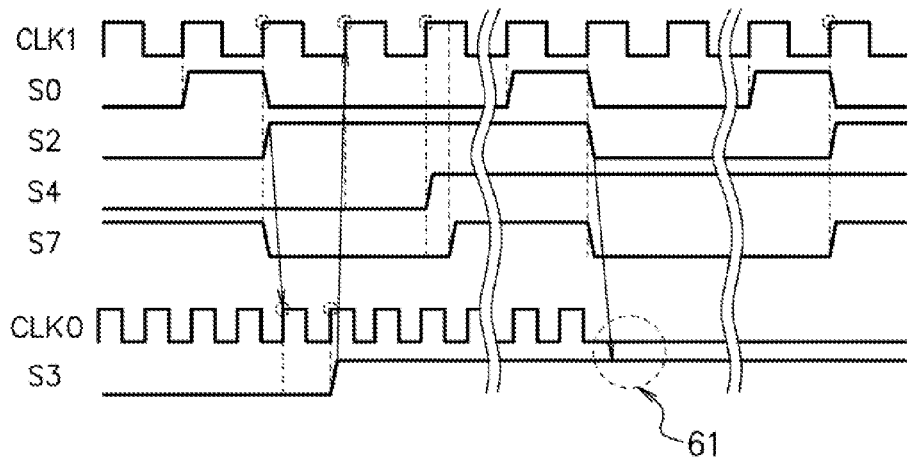
FIG. 6 is a diagram illustrating an example of operational waveforms of the clock stop detection unit in the present embodiment.

FIG. 5 and FIG. 6 are diagrams each illustrating an example of operational waveforms of the clock stop detection unit 24 in the present embodiment. FIG. 5 illustrates a case when a frequency of the detection object clock CLK0 is lower than a frequency of the detection clock CLK1. Besides, FIG. 6 illustrates a case when the frequency of the detection object clock CLK0 is higher than the frequency of the detection clock CLK1.

The counter unit 31 operated by the detection clock CLK1 sets the output signal S0 at "H" when the count is finished. When the output signal S0 is "H", the signal S1 in which the output signal S2 is inverted is input to the flip-flop 41 in the level output unit 32. The signal level of the output signal S2 of the level output unit 32 is inverted at a next clock edge of the detection clock CLK1. Note that when the output signal S0 is "L", the signal level of the output signal S2 of the level output unit 32 is maintained.

When the signal level of the output signal S2 changes (from "H" to "L", or from "L" to "H"), and the detection object clock CLK0 is not stopped, the output signal S2 passes through the clock transfer circuit 43 operated by the detection object clock CLK0, and the output signal S3 of the clock transfer circuit 43 changes into the same signal level as the output signal S2. If the detection object clock CLK0 is stopped, the signal level of the output signal S2 does not pass through the clock transfer circuit 43 (refer to parts of a circle 51 in dotted line in FIG. 5 and a circle 61 in dotted line in FIG. 6). The output signal S3 passes through the clock transfer circuit 44 operated by the detection clock CLK1, and the output signal S4 of the clock transfer circuit 44 becomes the same signal level as the output signal S3.

The signal levels of the output signal S4 and the output signal S2 are compared by the level comparison unit 34. When both the output signal S4 and the output signal S2 are "L", the output signal S5 of the AND circuit 45 becomes "H". When both the output signal S4 and the output signal S2 are "H", the output signal S6 of the AND circuit 46 becomes "H". Accordingly, the output signal S7 of the OR circuit 47 becomes "H" when the signal levels of the output signal S4 and the output signal S2 coincide, and the output signal S7 of the OR circuit 47 becomes "L" when the signal levels of the output signal S4 and the output signal S2 do not coincide.

When the counter unit 31 completes the count again and the output signal S0 becomes "H", it is determined that the detection object clock CLK0 is not stopped if the output signal S7 of the OR circuit 47 is "H". When the output signal S0 becomes "H", it is determined that the detection object clock CLK0 is stopped if the output signal S7 of the OR circuit 47 is "L".

According to the present embodiment, the signal level of the output signal of the level output unit 32 is inverted when the counter unit 31 operated by the detection clock CLK1 completes the count. It is detected if the detection object clock CLK0 is stopped in accordance with whether or not the change of the signal level propagates to the level comparison unit 34 by passing through the clock detection unit 33 including the clock transfer circuit 43 operated by the detection object clock CLK0. In the present embodiment, a detection period is determined by using the counter unit 31, and therefore, the frequency ratio of the detection object clock and the detection clock can be adjusted by changing a bit width of a counter at the counter unit 31. For example, when the clock stop detection unit in the present embodiment is provided by a soft-macro, it is easy to change the bit width of the counter, and the frequency ratio of the detection object clock and the detection clock can be adjusted easily. Besides, the clock stop is determined whether or not the signal level propagation passes through the clock transfer circuit operated by the detection object clock CLK0 while using the change of the signal level of the level output unit 32 as a base point. Here, it is possible to correspond to the circuit check tool such as the asynchronous verification because an asynchronous transfer circuit has a configuration in a general sequential circuit.

It is possible for the disclosed semiconductor device to easily adjust the frequency ratio of the detection object clock and the detection clock because the detection period is defined in accordance with the output of the counter unit. Besides, it is determined whether or not the detection object clock is stopped by checking if the level change of the output signal of the level output unit passes and propagates the clock detection unit operated by the detection object clock without using the reset. It is therefore possible to correspond to the circuit check tool.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device, comprising:
 a counter unit of which count value is changeable and operated by a detection clock;
 a level output unit that inverts a signal level of an output signal in accordance with an output of the counter unit;
 a clock detection unit that is operated by a detection object clock and passes the output signal of the level output unit;

a level comparison unit that compares a signal level of the output signal of the level output unit and a signal level of an output signal of the clock detection unit and outputs a comparison result; and a determination unit that determines whether or not the detection object clock is stopped based on the output of the level comparison unit at a certain timing.

2. The semiconductor device according to claim 1, wherein the clock detection unit includes a clock transfer circuit to which the detection object clock is supplied as a clock.

3. The semiconductor device according to claim 2, wherein the level output unit inverts a signal level of the output signal at a count completion time at the counter unit, and the determination unit determines whether or not the detection object clock is stopped at a next count completion time at the counter unit after the signal level is inverted at the level output unit.

4. The semiconductor device according to claim 1, wherein the level output unit inverts a signal level of the output signal at a count completion time at the counter unit, and the determination unit determines whether or not the detection object clock is stopped at a next count completion time at the counter unit after the signal level is inverted at the level output unit.

5. The semiconductor device according to claim 1, wherein the count value at the counter unit is set in accordance with a frequency ratio of the detection object clock and the detection clock.

6. A semiconductor device, comprising:

a counter unit of which count value is changeable, operated by a detection clock, and asserts an output signal in a pulse state at a count completion time;

a first flip-flop operated by the detection clock;

a selector that inverts an output of the first flip-flop and inputs to the first flip-flop when the output signal of the counter unit is asserted, and inputs the output of the first flip-flop to the first flip-flop when the output signal of the counter unit is not asserted;

a plurality of second flip-flops connected in series including a flip-flop operated by a detection object clock and in which the output of the first flip-flop is input to the flip-flop at a first stage;

a level comparison unit that compares the output of the first flip-flop and an output of the flip-flop at a final stage in the plurality of second flip-flops, and asserts an output signal when signal levels thereof are the same; and a determination unit that determines that the detection object clock is stopped when the output signal of the level comparison unit is not asserted if the output signal of the counter unit is asserted.

* * * * *